(12) United States Patent
Wu et al.

(10) Patent No.: US 11,471,922 B2
(45) Date of Patent: Oct. 18, 2022

(54) REAGENT BOTTLE CLEANING DEVICE

(71) Applicant: Shandong Fangming Pharmacy Group Co., Ltd., Heze (CN)

(72) Inventors: Shuangjun Wu, Heze (CN); Xin Chen, Heze (CN); Yanru Xu, Heze (CN); Song Wang, Heze (CN); Xin He, Heze (CN); Cuiling Liu, Heze (CN)

(73) Assignee: SHANDONG FANGMING PHARMACY GROUP CO., LTD., Shandong (CN)

( * ) Notice: Subject to any disclaimer, the term of this patent is extended or adjusted under 35 U.S.C. 154(b) by 499 days.

(21) Appl. No.: 16/694,287

(22) Filed: Nov. 25, 2019

(65) Prior Publication Data

US 2020/0306805 A1 Oct. 1, 2020

(30) Foreign Application Priority Data

Mar. 29, 2019 (CN) .......................... 201910247001.9

(51) Int. Cl.
| | |
|---|---|
| *B08B 9/38* | (2006.01) |
| *B08B 9/28* | (2006.01) |
| *H05K 7/20* | (2006.01) |
| *B08B 9/08* | (2006.01) |
| *H02P 7/00* | (2016.01) |
| *H02P 5/68* | (2006.01) |

(52) U.S. Cl.
CPC ............. *B08B 9/38* (2013.01); *B08B 9/0808* (2013.01); *B08B 9/28* (2013.01); *H05K 7/2039* (2013.01); *H02P 5/68* (2013.01); *H02P 7/00* (2013.01); *H02P 2203/09* (2013.01); *H02P 2205/01* (2013.01)

(58) Field of Classification Search
CPC ............ B08B 9/38; B08B 9/0808; B08B 9/28; H05K 7/2039; H02P 7/00; H02P 2203/09; H02P 2205/01
See application file for complete search history.

(56) References Cited

U.S. PATENT DOCUMENTS

| | | | | |
|---|---|---|---|---|
| 5,259,238 | A * | 11/1993 | Miura ................ | G01N 35/0099 73/54.11 |
| 5,617,768 | A * | 4/1997 | Palazzolo ............ | B23D 31/001 82/47 |
| 2002/0185423 | A1* | 12/2002 | Boyd ...................... | C01B 13/10 210/167.3 |
| 2007/0006939 | A1* | 1/2007 | Clusserath ............ | B67C 3/2628 141/40 |

(Continued)

*Primary Examiner* — Rafael O Leon De Domenech
(74) *Attorney, Agent, or Firm* — Muncy, Geissler, Olds & Lowe, P.C.

(57) ABSTRACT

A reagent bottle cleaning device is provided, comprising a base, a cleaning assembly, and a cleaning block. The cleaning assembly comprises a pushing cylinder and a mounting plate. A plurality of mounting grooves are disposed on the mounting plate. Each mounting groove is provided with a cleaning motor. The cleaning motor is provided with a cleaning screw rod. The cleaning block is provided with cleaning grooves corresponding to the cleaning screw rods. Injecting pumps are disposed between the cleaning block and the cleaning assembly. The injecting pumps are connected to the base by lifting cylinders. Full-automatic quick cleaning of reagent bottles can be realized under the effect of a main control chip.

9 Claims, 7 Drawing Sheets

(56) References Cited

U.S. PATENT DOCUMENTS

| | | | |
|---|---|---|---|
| 2020/0064364 A1* | 2/2020 | Ito | G01N 35/1004 |
| 2020/0377845 A1* | 12/2020 | Watanabe | B01F 31/26 |
| 2020/0386689 A1* | 12/2020 | Nordman | G01N 21/274 |
| 2021/0349052 A1* | 11/2021 | Hara | G01N 27/416 |

* cited by examiner

REAGENT BOTTLE CLEANING DEVICE

TECHNICAL FIELD

The present invention relates to a reagent bottle cleaning device.

BACKGROUND

Reagent bottles are indispensable container carriers in the pharmaceutical industry. They are widely used and can be classified into a variety of types such as wide-mouth, narrow-mouth, ground, and non-ground bottles. The wide-mouth bottles are used for holding solid reagents, and the narrow-mouth bottles are used for holding liquid reagents. The brown bottles are used to protect reagents from light. The ground stopper bottles can prevent the reagents from moisture absorption and concentration change.

In the pharmaceutical industry, a large number of reagent bottles of different types are often used for corresponding technological operations. The reagent bottles need to be cleaned after use, for the next use by users after the cleaning is completed.

Most existing reagent bottles are cleaned manually, and residual drugs in the reagent bottles are taken out by some drying devices or clearing devices. This cleaning method has a long working cycle and low cleaning efficiency, and it is easy to cause drug residues in the reagent bottles.

SUMMARY

A reagent bottle cleaning device is provided in embodiments of the present invention. The structure design is reasonable, and full-automatic quick cleaning of reagent bottles can be realized under the effect of a main control chip, such that the working cycle is shortened, the cleaning efficiency is improved, and the problem existing in the prior art is solved.

The technical solution adopted by the present invention to solve the above technical problem is as follows.

A reagent bottle cleaning device, comprising a base; and a cleaning assembly disposed at the top of the base, wherein the cleaning assembly comprises a plurality of pushing cylinders with piston rods disposed downward, a mounting plate matching the base is provided on the piston rods of the pushing cylinders, a plurality of mounting grooves are disposed on the mounting plate, each mounting groove is provided with a cleaning motor with an output shaft disposed downward, the output shaft of each cleaning motor is provided with a cleaning screw rod, a cleaning block matching the cleaning assembly is disposed at the bottom of the base, the cleaning block is provided with a plurality of cleaning grooves corresponding to the cleaning screw rods, a plurality of injecting pumps are disposed between the cleaning block and the cleaning assembly, and the injecting pumps are connected to the base by lifting cylinders respectively.

Sliding chutes matching the mounting plate are disposed on two sides of the base respectively, and each sliding chute is provided with a plurality of positioning holes at intervals, and reinforcing bolts matching the positioning holes are disposed on two sides of the mounting plate.

The base is further provided with a controller which is connected to the pushing cylinder, the cleaning motor, the injecting pump, and the lifting cylinder respectively.

The controller comprises a main control chip whose model is STM32F103, the main control chip is connected to a voltage regulator module by a voltage output pin Vout, connected to a heat dissipation module by a power supply pin Ua and a voltage feedback pin Ub, and connected to a test module by a communication pin SPI and a current test pin Ig.

The voltage regulator module comprises a voltage regulator chip whose model is MP1584, the voltage regulator chip is provided with nine pins, Pin 1 of the voltage regulator chip is connected to a first inductor, the first inductor is connected to a first resistor, the first resistor is connected to Pin 4 of the voltage regulator chip, the first resistor is connected to a second resistor, the second resistor is grounded, Pin 1 of the voltage regulator chip is connected in parallel with a first capacitor, a second capacitor, a third capacitor, and a third resistor, the third resistor is connected to a light emitting diode, Pin 1 of the voltage regulator chip is connected to a voltage output pin and connected to a fourth capacitor, the fourth capacitor is connected to Pin 8 of the voltage regulator chip, a first diode is connected to the fourth capacitor, and the first diode is grounded; Pin 5 and Pin 9 of the voltage regulator chip are connected to each other and grounded; Pin 2 of the voltage regulator chip is connected to a fourth resistor, the fourth resistor is connected to Pin 7 of the voltage regulator chip, Pin 7 of the voltage regulator chip is connected in parallel with a fifth capacitor and a sixth capacitor and grounded, Pin 7 of the voltage regulator chip is connected to a voltage input pin, Pin 3 of the voltage regulator chip is connected to a seventh capacitor, the seventh capacitor is connected to a fifth resistor, the fifth resistor is grounded, Pin 6 of the voltage regulator chip is connected to a sixth resistor, and the sixth resistor is grounded.

The test module comprises a current test chip whose model is MCP4821, Pin 1 of the current test chip is connected to a voltage output pin and connected to an eighth capacitor, the eighth capacitor is connected to Pin 7 of the current test chip, Pin 7 of the current test chip is grounded, Pin 8 of the current test chip is connected to a seventh resistor, the seventh resistor is connected in parallel with an eighth resistor and a ninth capacitor and grounded, the seventh resistor is connected to a first operational amplifier, the first operational amplifier is connected to a ninth resistor, the ninth resistor is connected to a second operational amplifier, the second operational amplifier is connected to a tenth resistor, the tenth resistor is connected to the base of a first triode, the collector of the first triode is connected to the current test chip, the emitter of the first triode is connected to an eleventh resistor, and the eleventh resistor is grounded; Pin 2 of the current test chip is connected to a twelfth resistor, the twelfth resistor is connected to an SPI_CS pin of the main control chip, Pin 3 of the current test chip is connected to a thirteenth resistor, the thirteenth resistor is connected to an SPI_SCK pin of the main control chip, Pin 4 of the current test chip is connected to a fourteenth resistor, the fourteenth resistor is connected to an SPI_MOSI pin of the main control chip, and Pin 5 and Pin 6 of the current test chip are suspended.

The models of the first operational amplifier and the second operational amplifier are both LM2904.

The heat dissipation module comprises a heat dissipation chip whose model is TC4427, Pin 3 of the heat dissipation chip is grounded, and Pin 4 of the heat dissipation chip is connected to the voltage feedback pin Ub of the main control chip; Pin 5 of the heat dissipation chip is connected to a sixteenth resistor, the sixteenth resistor is connected to a seventeenth resistor, the seventeenth resistor is grounded, the sixteenth resistor is connected to a first MOS tube, and the first MOS tube is connected to a cooling fan; Pin 6 of the main control chip is connected in parallel with a tenth capacitor and an eleventh capacitor; Pin 7 of the heat dissipation chip is connected to a fifteenth resistor, the fifteenth resistor is connected to the power supply pin Ua, and Pin 1, Pin 2, and Pin 8 of the heat dissipation chip are suspended.

Each cleaning groove is provided with an elastic rubber pad.

In the present invention, by use of the above structure, the pushing cylinders, the cleaning motors, the injecting pumps, and the lifting cylinders on the device are controlled by the main control chip to operate, thus injecting a cleaning agent into reagent bottles and completing the cleaning process. The sliding chutes on the two sides of the base, the positioning holes, and the reinforcing bolts cooperate with each other to allow the cleaning screw rods to constantly perform cleaning in the cleaning grooves. A detection module in the controller detects the current of the cleaning motor to fed back the rotational speed of the cleaning motor to the main control chip, so that the main control chip can control the operation of the device more accurately. A stable power supply voltage is provided for the main control chip by the voltage regulator module, and the heat dissipation module enables the main control chip to be in a good working state, so that the main control chip can accurately control the operations of the components in the device, thus having the advantages of a fast cleaning speed and high working efficiency.

In the figures, 1. base, 2. pushing cylinder, 3. mounting plate, 4. mounting groove, 5. cleaning motor, 6. cleaning screw rod, 7. cleaning block, 8. cleaning groove, 9. injecting pump, 10. lifting cylinder, 11. sliding chute, 12. positioning hole, 13. reinforcing bolt, 14. controller, 15. elastic rubber pad.

DETAILED DESCRIPTION

In order to describe the technical characteristics of the solution clearly, the present invention is illustrated in detail in the following through specific implementations and with reference to the accompanying drawings.

As shown in FIG. 1 to FIG. 7, a reagent bottle cleaning device includes a base 1; and a cleaning assembly disposed at the top of the base 1. The cleaning assembly includes a plurality of pushing cylinders 2 with piston rods disposed downward. A mounting plate 3 matching the base 1 is disposed on the piston rods of the pushing cylinders 2. A plurality of mounting grooves 4 are disposed on the mounting plate 3, each mounting groove 4 is provided with a cleaning motor 5 with an output shaft disposed downward, and the output shaft of each cleaning motor 5 is provided with a cleaning screw rod 6. A cleaning block 7 matching the cleaning assembly is disposed at the bottom of the base 1, and the cleaning block 7 is provided with a plurality of cleaning grooves 8 corresponding to the cleaning screw rods 6. A plurality of injecting pumps 9 are disposed between the cleaning block 7 and the cleaning assembly, and the injecting pumps 9 are connected to the base 1 by lifting cylinders 10 respectively.

Figure 1:
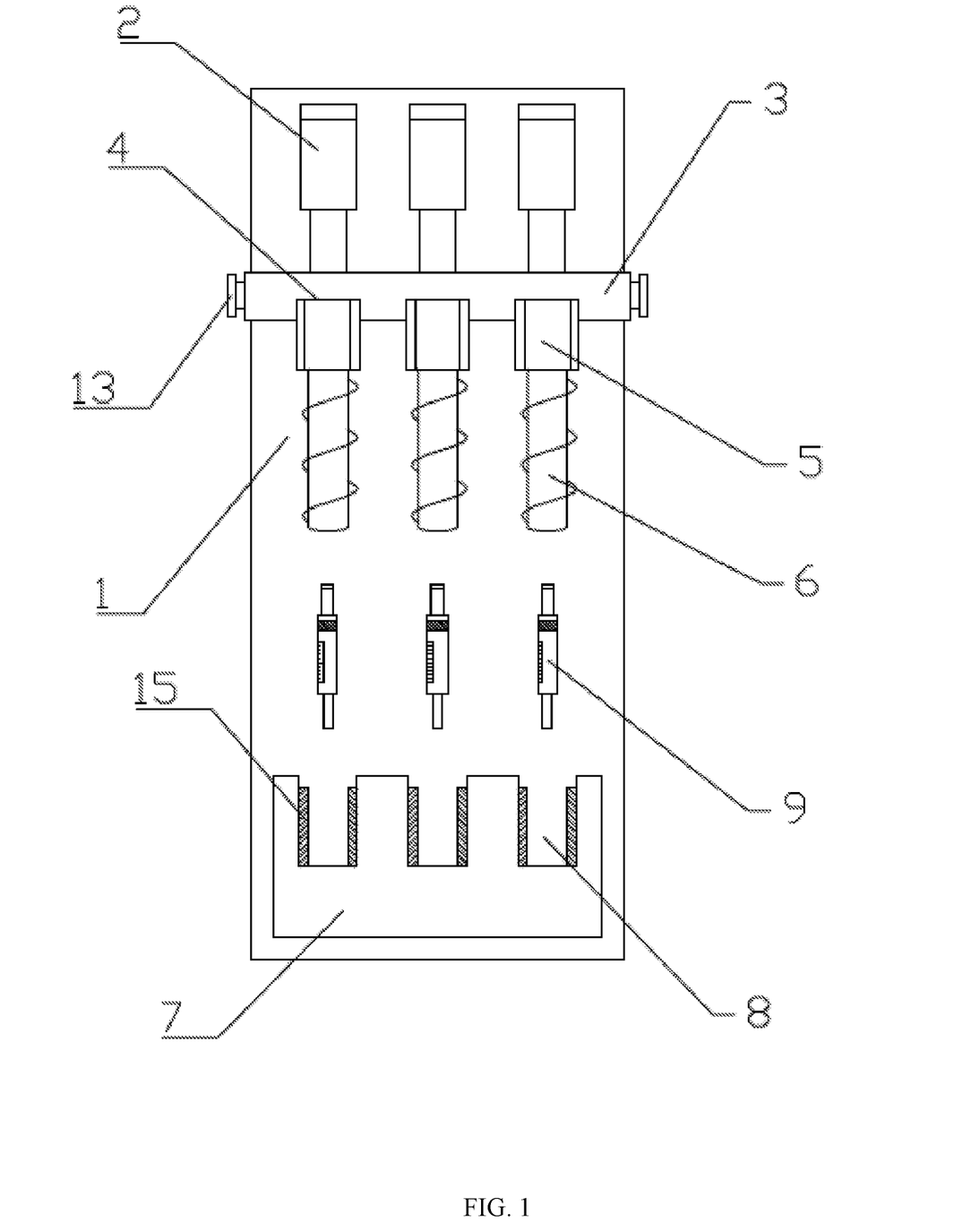
FIG. 1 is a schematic structural diagram according to the present invention.
Figure 2:
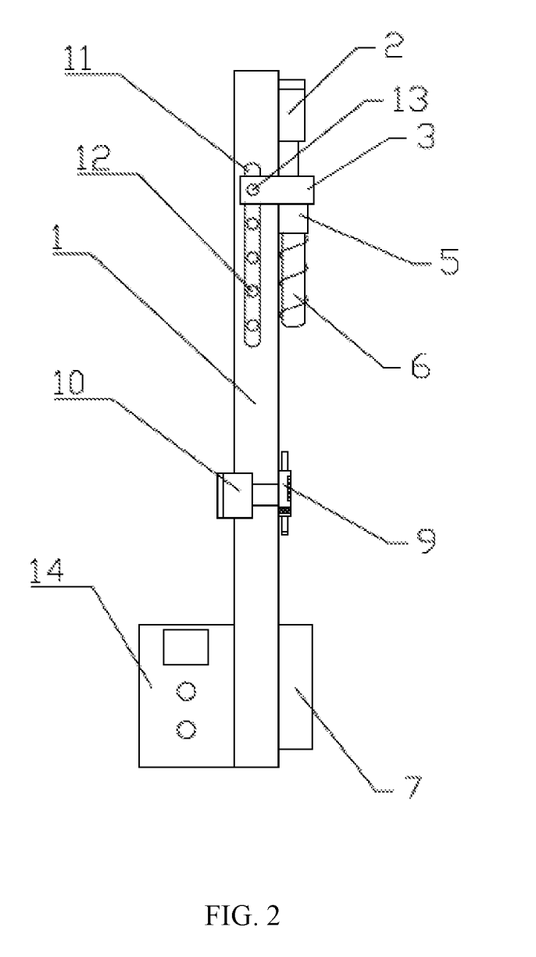
FIG. 2 is a top view of FIG. 1.

Sliding chutes 11 matching the mounting plate 3 are disposed on two sides of the base 1 respectively. Each sliding chute 11 is provided with a plurality of positioning holes 12 at intervals, and reinforcing bolts 13 matching the positioning holes 12 are disposed on two sides of the mounting plate 3.

The base 1 is further provided with a controller 14 which is connected to the pushing cylinder 2, the cleaning motor 5, the injecting pump 9, and the lifting cylinder 10 respectively.

Figure 4:
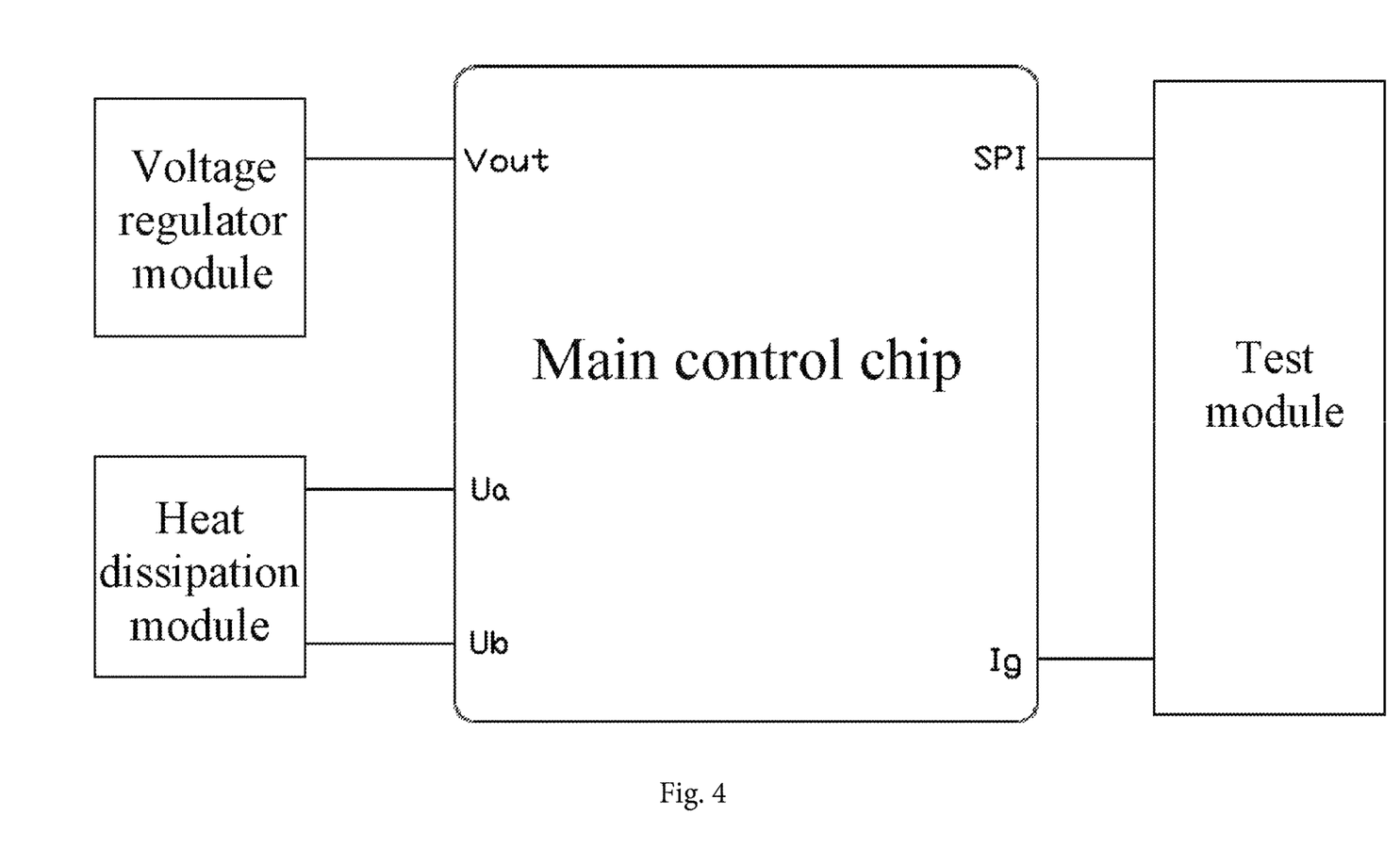
FIG. 4 is an electrical block diagram according to the present invention.

The controller 14 includes a main control chip whose model is STM32F103. The main control chip is connected to a voltage regulator module by a voltage output pin Vout, connected to a heat dissipation module by a power supply pin Ua and a voltage feedback pin Ub, and connected to a test module by a communication pin SPI and a current test pin Ig.

Figure 5:
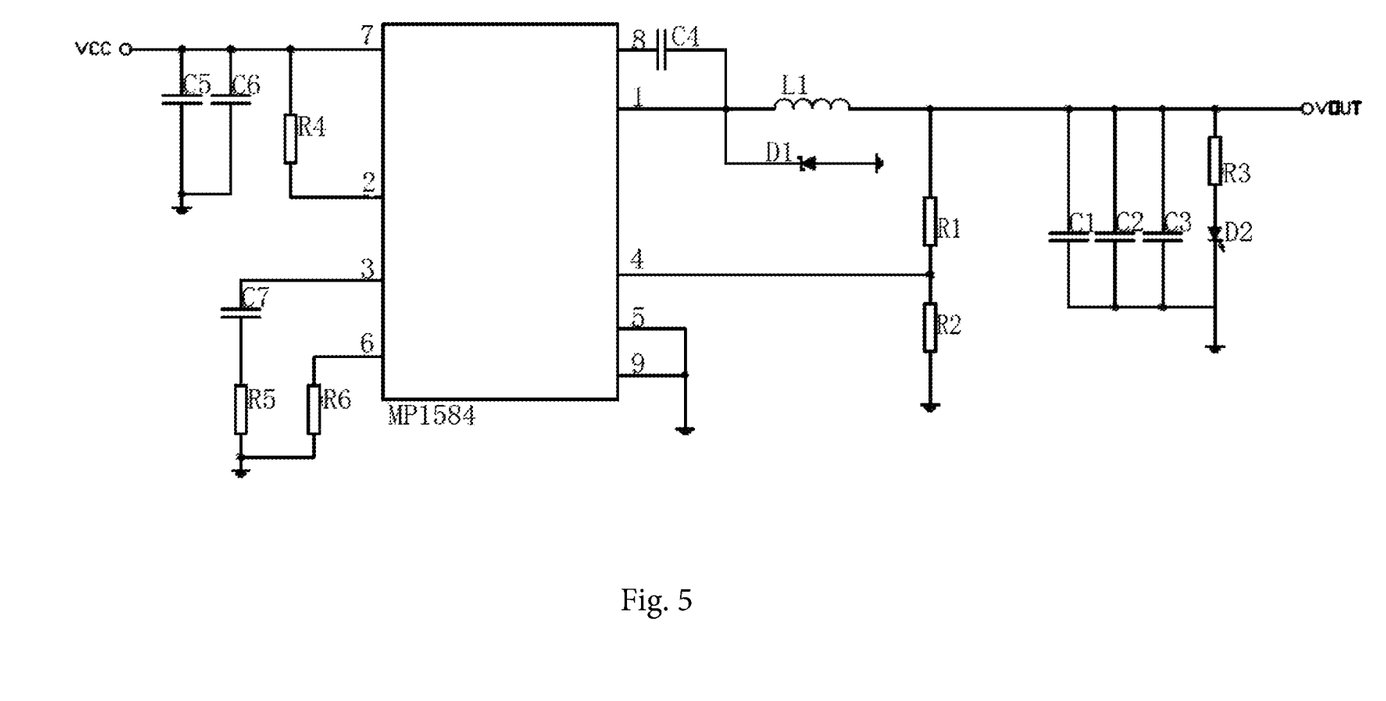
FIG. 5 is an electrical schematic diagram of a voltage regulator module according to the present invention.

The voltage regulator module includes a voltage regulator chip whose model is MP1584. The voltage regulator chip is provided with nine pins. Pin 1 of the voltage regulator chip is connected to a first inductor, the first inductor is connected to a first resistor, the first resistor is connected to Pin 4 of the voltage regulator chip, the first resistor is connected to a second resistor, and the second resistor is grounded. Pin 1 of the voltage regulator chip is connected in parallel with a first capacitor, a second capacitor, a third capacitor, and a third resistor, and the third resistor is connected to a light emitting diode. Pin 1 of the voltage regulator chip is connected to a voltage output pin and connected to a fourth capacitor. The fourth capacitor is connected to Pin 8 of the voltage regulator chip, a first diode is connected to the fourth capacitor, and the first diode is grounded. Pin 5 and Pin 9 of the voltage regulator chip are connected to each other and grounded. Pin 2 of the voltage regulator chip is connected to a fourth resistor, the fourth resistor is connected to Pin 7 of the voltage regulator chip, Pin 7 of the voltage regulator chip is connected in parallel with a fifth capacitor and a sixth capacitor and grounded, and Pin 7 of the voltage regulator chip is connected to a voltage input pin. Pin 3 of the voltage regulator chip is connected to a seventh capacitor, the seventh capacitor is connected to a fifth resistor, and the fifth resistor is grounded. Pin 6 of the voltage regulator chip is connected to a sixth resistor, and the sixth resistor is grounded.

Figure 6:
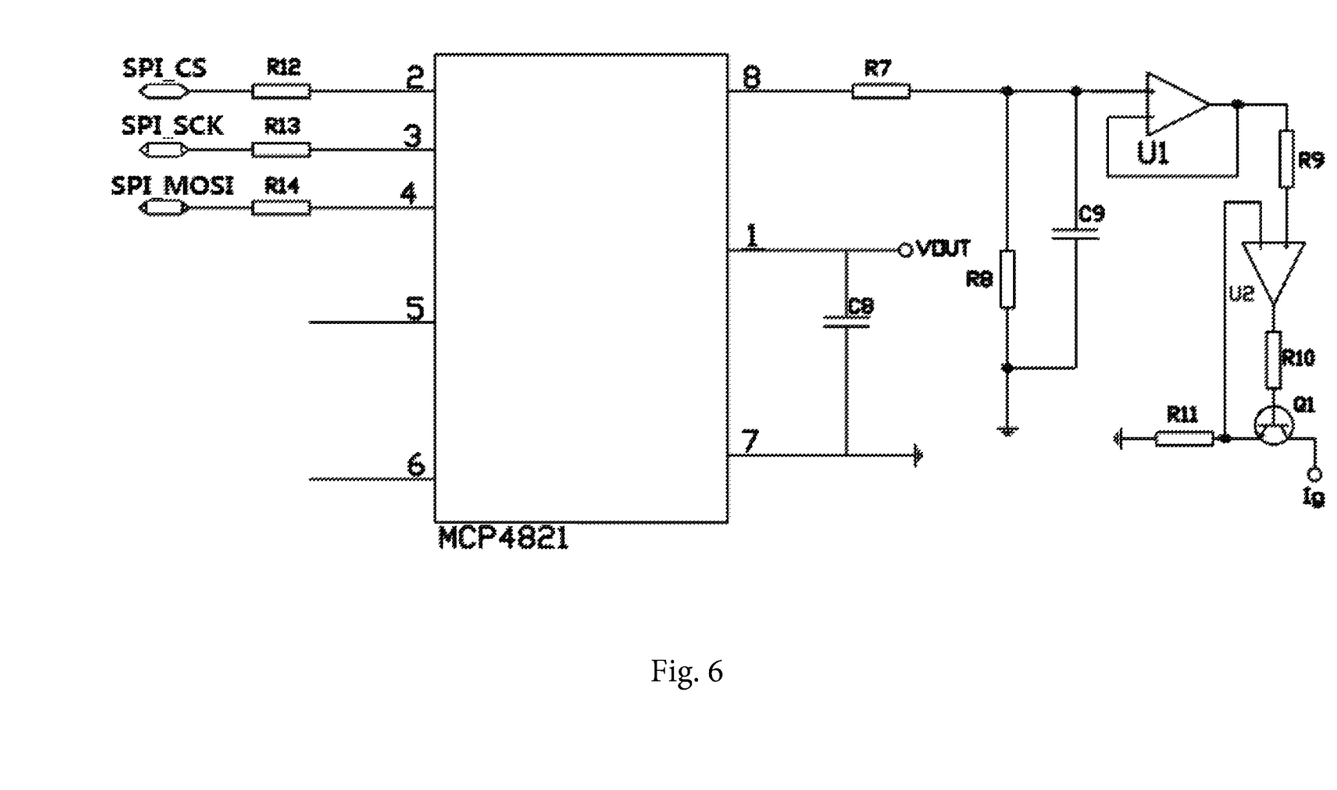
FIG. 6 is an electrical schematic diagram of a test module according to the present invention.

The test module includes a current test chip whose model is MCP4821. Pin 1 of the current test chip is connected to a voltage output pin, and connected to an eighth capacitor. The eighth capacitor is connected to Pin 7 of the current test chip, and Pin 7 of the current test chip is grounded. Pin 8 of the current test chip is connected to a seventh resistor, and the seventh resistor is connected in parallel with an eighth resistor and a ninth capacitor and is grounded. The seventh resistor is connected to a first operational amplifier, and the first operational amplifier is connected to a ninth resistor. The ninth resistor is connected to a second operational amplifier, and the second operational amplifier is connected to a tenth resistor, the tenth resistor is connected to the base of a first triode, the collector of the first triode is connected to the current test chip, the emitter of the first triode is connected to an eleventh resistor, and the eleventh resistor is grounded. Pin 2 of the current test chip is connected to a twelfth resistor, and the twelfth resistor is connected to an SPI_CS pin of the main control chip. Pin 3 of the current test chip is connected to a thirteenth resistor, and the thirteenth resistor is connected to an SPI_SCK pin of the main control chip. Pin 4 of the current test chip is connected to a fourteenth resistor, and the fourteenth resistor is connected to an SPI_MOSI pin of the main control chip. Pin 5 and Pin 6 of the current test chip are suspended.

The models of the first operational amplifier and the second operational amplifier are both LM2904.

Figure 7:
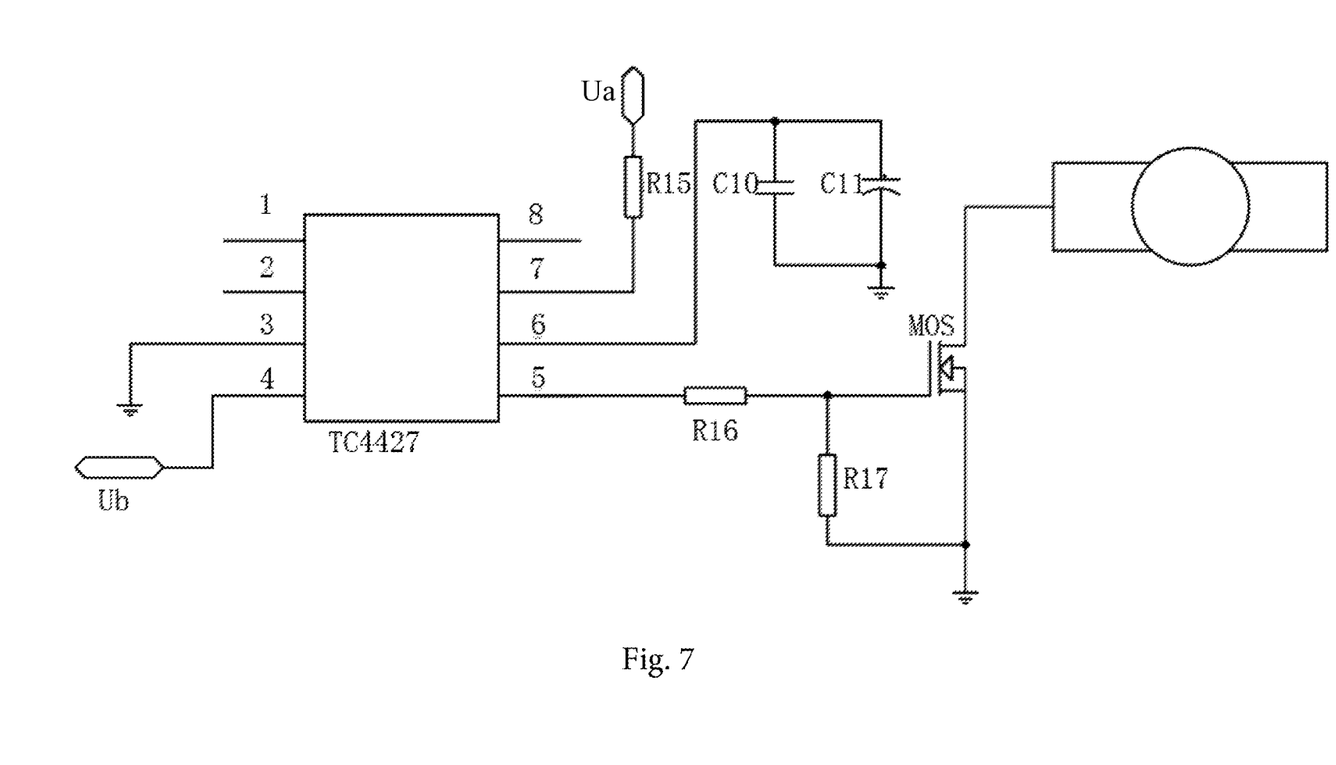
FIG. 7 is an electrical schematic diagram of a heat dissipation module according to the present invention.

The heat dissipation module includes a heat dissipation chip whose model is TC4427. Pin 3 of the heat dissipation chip is grounded, and Pin 4 of the heat dissipation chip is connected to the voltage feedback pin Ub of the main control chip. Pin 5 of the heat dissipation chip is connected to a sixteenth resistor, the sixteenth resistor is connected to a seventeenth resistor, and the seventeenth resistor is grounded. The sixteenth resistor is connected to a first MOS tube, and the first MOS tube is connected to a cooling fan. Pin 6 of the main control chip is connected in parallel with a tenth capacitor and an eleventh capacitor. Pin 7 of the heat dissipation chip is connected to a fifteenth resistor, and the fifteenth resistor is connected to the power supply pin Ua. Pin 1, Pin 2, and Pin 8 of the heat dissipation chip are suspended.

Each cleaning groove 8 is provided with an elastic rubber pad 15, so that reagent bottles of different specifications can be clamped in the cleaning groove 8.

Figure 3:
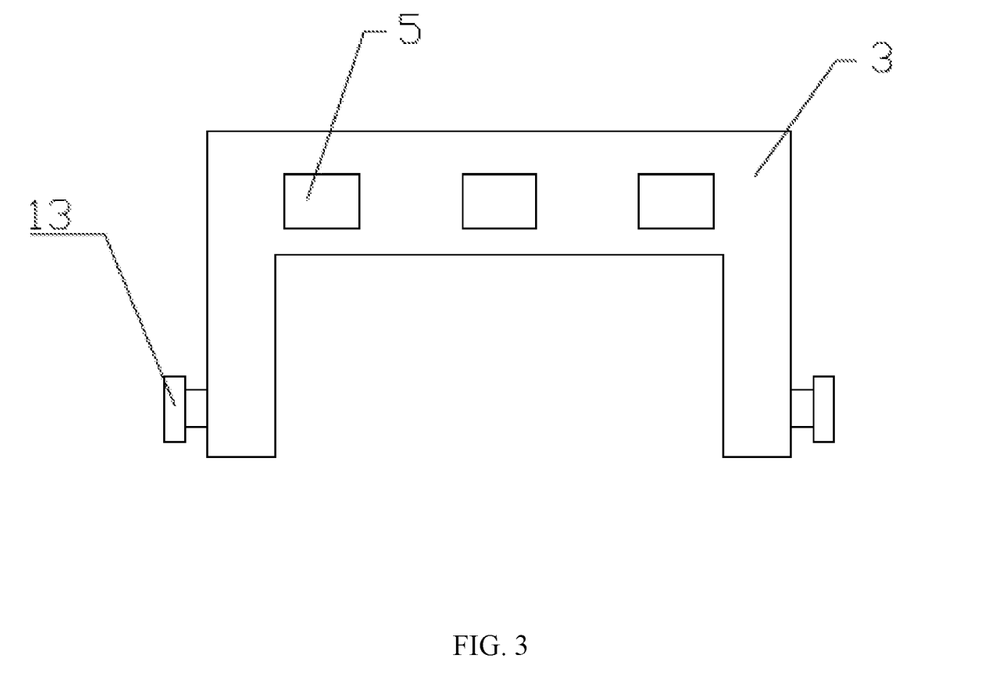
FIG. 3 is a schematic structural diagram of a mounting plate according to the present invention.

In use, the reagent bottles to be cleaned are placed in sequence in the cleaning grooves 8 on the cleaning block 7. The reagent bottles of different specifications can be tightened in the cleaning grooves 8 by the elastic rubber pads 15 in the cleaning grooves 8. An instruction is sent by the controller 14 to the pushing cylinders 2 to drive the mounting plate 3 to move. The mounting grooves 4 in the mounting plate 3 is provided with cleaning motors 5. The lifting cylinders 10 are operated to drive the injecting pumps 9 to rise to the surface of the base 1. Injection heads of the injecting pumps 9 are aligned with openings of the reagent bottles, and the cleaning agent is injected into the reagent bottles. An instruction is transmitted to the lifting cylinders 10 by the controller 14. The injecting pumps 9 are driven by the lifting cylinders 10 to drop, such that the injecting pumps 9 are placed in the base 1. An instruction is sent to the pushing cylinders 2 continuously by the controller 14. The pushing cylinders 2 are dropped, so that the cleaning screw rods 6 are extended into the reagent bottles. At the same time, the reinforcing bolts 13 are secured in the positioning holes 12 to fix the position of the mounting plate 3. An instruction is sent to the cleaning motors 5 by the controller 14. The cleaning motors 5 are operated to drive the cleaning screw rods 6 to stir and clean in the reagent bottles. A corresponding cleaning time period can be set in the controller 14 according to an actual condition of the reagent bottle, which ensures a cleaning effect and prevents drug residues in the reagent bottle. The voltage regulator module and the heat dissipation module in the controller 14 enable the main control chip to be kept in a good working state, and provide a stable power supply voltage and a stable working temperature for the main control chip, so that the main control chip will not be burnt out due to an excessive temperature to make the cleaning device incapable of working normally. The rotational speed of the cleaning motor 5 can be obtained by the detection module on the main control chip according to a current value obtained by feedback, so that the main control chip can adjust the rotational speed of the cleaning motor 5 at any time, achieving a better cleaning effect. Through the main control chip, the heat dissipation chip, the current test chip, and the voltage regulator chip as well as their peripheral connection circuits, the program running and data transmission are more accurate, which allows a user to clean the reagent bottle more conveniently, improves the work efficiency, and prevents drug residues in the reagent bottle.

The above specific implementations cannot be used as limitations to the protection scope of the present invention. For those skilled in the art, any alternative improvements or changes made to the implementations of the present invention are all encompassed in the protection scope of the present invention.

Contents not described in detail in the present invention are all common technologies for those skilled in the art.

The invention claimed is:

1. A reagent bottle cleaning device, comprising a base; and a cleaning assembly disposed at the top of the base, wherein the cleaning assembly comprises a plurality of pushing cylinders with piston rods disposed downward, a mounting plate matching the base is provided on the piston rods of the pushing cylinders, a plurality of mounting grooves are disposed on the mounting plate, each mounting groove is provided with a cleaning motor with an output shaft disposed downward, the output shaft of each cleaning motor is provided with a cleaning screw rod, a cleaning block matching the cleaning assembly is disposed at the bottom of the base, the cleaning block is provided with a plurality of cleaning grooves corresponding to the cleaning screw rods, a plurality of injecting pumps are disposed between the cleaning block and the cleaning assembly, and the injecting pumps are connected to the base by lifting cylinders respectively.

2. The device of claim 1, wherein sliding chutes matching the mounting plate are disposed on two sides of the base respectively, each sliding chute is provided with a plurality of positioning holes at intervals, and reinforcing bolts matching the positioning holes are disposed on two sides of the mounting plate.

3. The device of claim 1, wherein the base is further provided with a controller which is connected to the pushing cylinder, the cleaning motor, the injecting pump, and the lifting cylinder respectively.

4. The device of claim 3, wherein the controller comprises a main control chip whose model is STM32F103, the main control chip is connected to a voltage regulator module by a voltage output pin Vout, connected to a heat dissipation module by a power supply pin Ua and a voltage feedback pin Ub, and connected to a test module by a communication pin SPI and a current test pin Ig.

5. The device of claim 4, wherein the voltage regulator module comprises a voltage regulator chip whose model is MP1584, the voltage regulator chip is provided with nine pins, Pin 1 of the voltage regulator chip is connected to a first inductor, the first inductor is connected to a first resistor, the first resistor is connected to Pin 4 of the voltage regulator chip, the first resistor is connected to a second resistor, the second resistor is grounded, Pin 1 of the voltage regulator chip is connected in parallel with a first capacitor, a second capacitor, a third capacitor, and a third resistor, the third resistor is connected to a light emitting diode, Pin 1 of the voltage regulator chip is connected to a voltage output pin and connected to a fourth capacitor, the fourth capacitor is connected to Pin 8 of the voltage regulator chip, a first diode is connected to the fourth capacitor, and the first diode is grounded; Pin 5 and Pin 9 of the voltage regulator chip are connected to each other and grounded; Pin 2 of the voltage regulator chip is connected to a fourth resistor, the fourth resistor is connected to Pin 7 of the voltage regulator chip, Pin 7 of the voltage regulator chip is connected in parallel with a fifth capacitor and a sixth capacitor and grounded, Pin 7 of the voltage regulator chip is connected to a voltage input pin, Pin 3 of the voltage regulator chip is connected to a seventh capacitor, the seventh capacitor is connected to a fifth resistor, the fifth resistor is grounded, Pin 6 of the voltage regulator chip is connected to a sixth resistor, and the sixth resistor is grounded.

6. The device of claim 5, wherein the test module comprises a current test chip whose model is MCP4821, Pin 1 of the current test chip is connected to a voltage output pin and connected to an eighth capacitor, the eighth capacitor is connected to Pin 7 of the current test chip, Pin 7 of the current test chip is grounded, Pin 8 of the current test chip is connected to a seventh resistor, the seventh resistor is connected in parallel with an eighth resistor and a ninth capacitor and grounded, the seventh resistor is connected to a first operational amplifier, the first operational amplifier is connected to a ninth resistor, the ninth resistor is connected to a second operational amplifier, the second operational amplifier is connected to a tenth resistor, the tenth resistor is connected to the base of a first triode, the collector of the first triode is connected to the current test chip, the emitter of the first triode is connected to an eleventh resistor, and the eleventh resistor is grounded; Pin 2 of the current test chip is connected to a twelfth resistor, the twelfth resistor is connected to an SPI_CS pin of the main control chip, Pin 3 of the current test chip is connected to a thirteenth resistor, the thirteenth resistor is connected to an SPI_SCK pin of the main control chip, Pin 4 of the current test chip is connected to a fourteenth resistor, the fourteenth resistor is connected to an SPI_MOSI pin of the main control chip, and Pin 5 and Pin 6 of the current test chip are suspended.

7. The device of claim 6, wherein the models of the first operational amplifier and the second operational amplifier are both LM2904.

8. The device of claim 4, wherein the heat dissipation module comprises a heat dissipation chip whose model is TC4427, Pin 3 of the heat dissipation chip is grounded, and Pin 4 of the heat dissipation chip is connected to the voltage feedback pin Ub of the main control chip; Pin 5 of the heat dissipation chip is connected to a sixteenth resistor, the sixteenth resistor is connected to a seventeenth resistor, the seventeenth resistor is grounded, the sixteenth resistor is connected to a first MOS tube, and the first MOS tube is connected to a cooling fan; Pin 6 of the main control chip is connected in parallel with a tenth capacitor and an eleventh capacitor; Pin 7 of the heat dissipation chip is connected to a fifteenth resistor, the fifteenth resistor is connected to the power supply pin Ua, and Pin 1, Pin 2, and Pin 8 of the heat dissipation chip are suspended.

9. The device of claim 1, wherein each cleaning groove is provided with an elastic rubber pad.

* * * * *